(12) United States Patent
Castro et al.

(10) Patent No.:  US 12,597,450 B2
(45) **Date of Patent:       \*Apr. 7, 2026**

(54) PULSE BASED MULTI-LEVEL CELL PROGRAMMING

(71) Applicant: Micron Technology, Inc., Boise, ID (US)

(72) Inventors: Hernan A. Castro, Shingle Springs, CA (US); Mattia Boniardi, Cormano (IT); Innocenzo Tortorelli, Cernusco Sul Naviglio (IT)

(73) Assignee: Micron Technology, Inc., Boise, ID (US)

( \* ) Notice: Subject to any disclaimer, the term of this patent is extended or adjusted under 35 U.S.C. 154(b) by 0 days.

This patent is subject to a terminal disclaimer.

(21) Appl. No.: 18/633,362

(22) Filed: Apr. 11, 2024

(65) Prior Publication Data

US 2024/0347081 A1      Oct. 17, 2024

Related U.S. Application Data

(63) Continuation of application No. 17/740,069, filed on May 9, 2022, now Pat. No. 11,984,191.

(51) Int. Cl.
| | |
|---|---|
| *G11C 7/10* | (2006.01) |
| *G11C 16/34* | (2006.01) |

(52) U.S. Cl.
CPC ............ *G11C 7/1039* (2013.01); *G11C 7/106* (2013.01); *G11C 7/1066* (2013.01); *G11C 7/1087* (2013.01); *G11C 7/1093* (2013.01); *G11C 16/3404* (2013.01)

(58) Field of Classification Search
CPC .................................................... G11C 7/1039
USPC ..................................................... 365/230.11
See application file for complete search history.

(56) References Cited

U.S. PATENT DOCUMENTS

| | | | |
|---|---|---|---|
| 10,381,075 B2 | 8/2019 | Totorelli et al. | |
| 10,546,632 B2 | 1/2020 | Redaelli et al. | |
| 10,803,939 B2 | 10/2020 | Castro et al. | |
| 11,177,009 B2 | 11/2021 | Hirst et al. | |
| 11,295,822 B2 | 4/2022 | Sarpatwari et al. | |
| 11,315,633 B2 | 4/2022 | Castro et al. | |
| 11,984,191 B2 * | 5/2024 | Castro .................. | G11C 7/1087 |
| 2003/0027134 A1 | 2/2003 | Egashira et al. | |
| 2015/0129829 A1 | 5/2015 | Kumar | |
| 2018/0122472 A1 | 5/2018 | Pirovano et al. | |
| 2019/0378568 A1 | 12/2019 | Robustelli | |

(Continued)

*Primary Examiner* — Hoai V Ho
(74) *Attorney, Agent, or Firm* — Holland & Hart LLP

(57)                  ABSTRACT

Methods, systems, and devices for pulse based multi-level cell programming are described. A memory device may identify an intermediate logic state to store to a multi-level memory cell capable of storing three or more logic states. The memory device may apply a first pulse with a first polarity to the memory cell to store a SET or RESET state to the memory cell based on identifying the intermediate logic state. As such, the memory device may identify a threshold voltage of the memory cell that stores the SET or RESET state. The memory device may apply a quantity of pulses to the memory cell to store the identified intermediate logic state based on identifying the threshold voltage of the memory cell that stores the SET or RESET state. In some examples, the quantity of pulses may have a second polarity different than the first polarity.

20 Claims, 9 Drawing Sheets

(56)         References Cited

U.S. PATENT DOCUMENTS

| | | |
|---|---|---|
| 2020/0365221 A1 | 11/2020 | Yang et al. |
| 2021/0005250 A1 | 1/2021 | Tortorelli |
| 2022/0238171 A1 | 7/2022 | Chung |
| 2023/0154541 A1 | 5/2023 | Yuan et al. |

* cited by examiner

SECTION A-A

☒ Unselected Memory Cell 105     ■ Selected Memory Cell 105-a

SECTION B-B

☒ Unselected Memory Cell 105　　■ Selected Memory Cell 105-a

200

SECTION C-C

☒ Unselected Memory Cell 105　　■ Selected Memory Cell 105-a

200

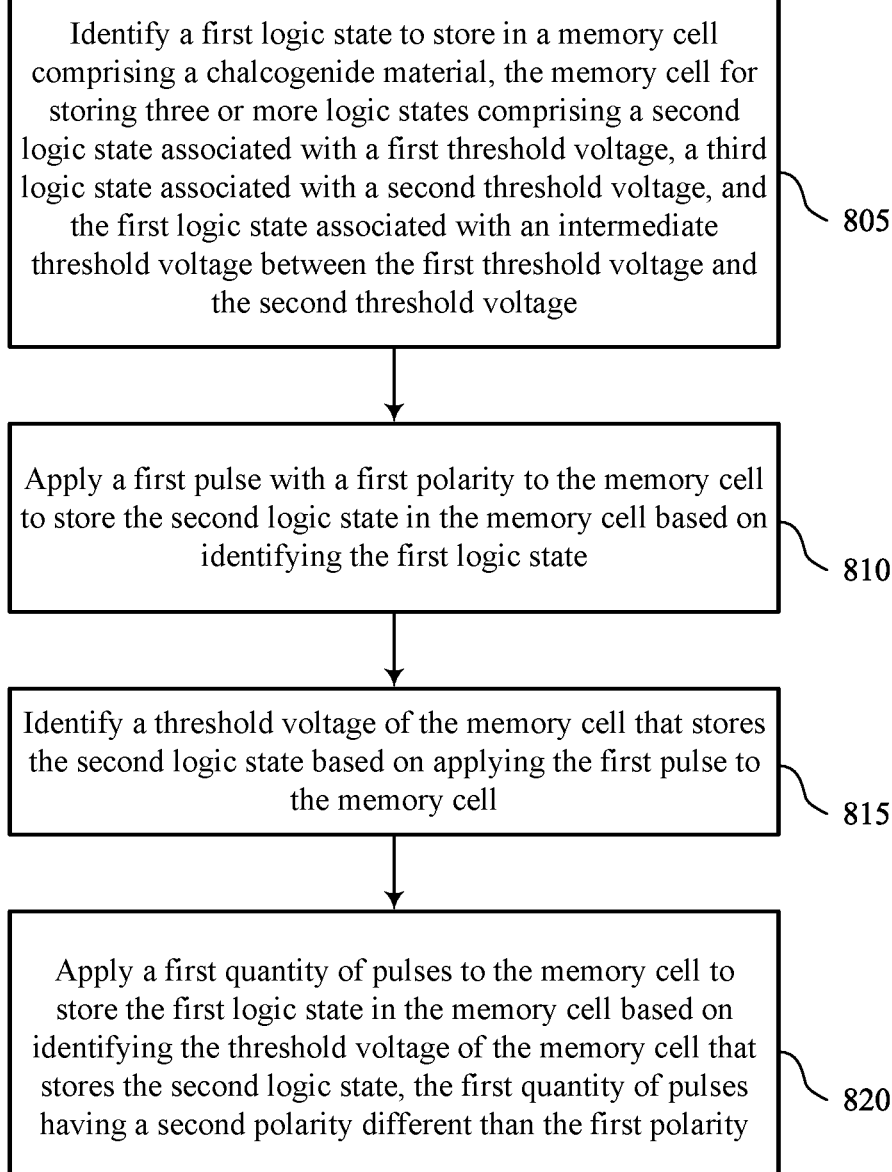

Identify a first logic state to store in a memory cell comprising a chalcogenide material, the memory cell for storing three or more logic states comprising a second logic state associated with a first threshold voltage, a third logic state associated with a second threshold voltage, and the first logic state associated with an intermediate threshold voltage between the first threshold voltage and the second threshold voltage

805

Apply a first pulse with a first polarity to the memory cell to store the second logic state in the memory cell based on identifying the first logic state

810

Identify a threshold voltage of the memory cell that stores the second logic state based on applying the first pulse to the memory cell

815

Apply a first quantity of pulses to the memory cell to store the first logic state in the memory cell based on identifying the threshold voltage of the memory cell that stores the second logic state, the first quantity of pulses having a second polarity different than the first polarity

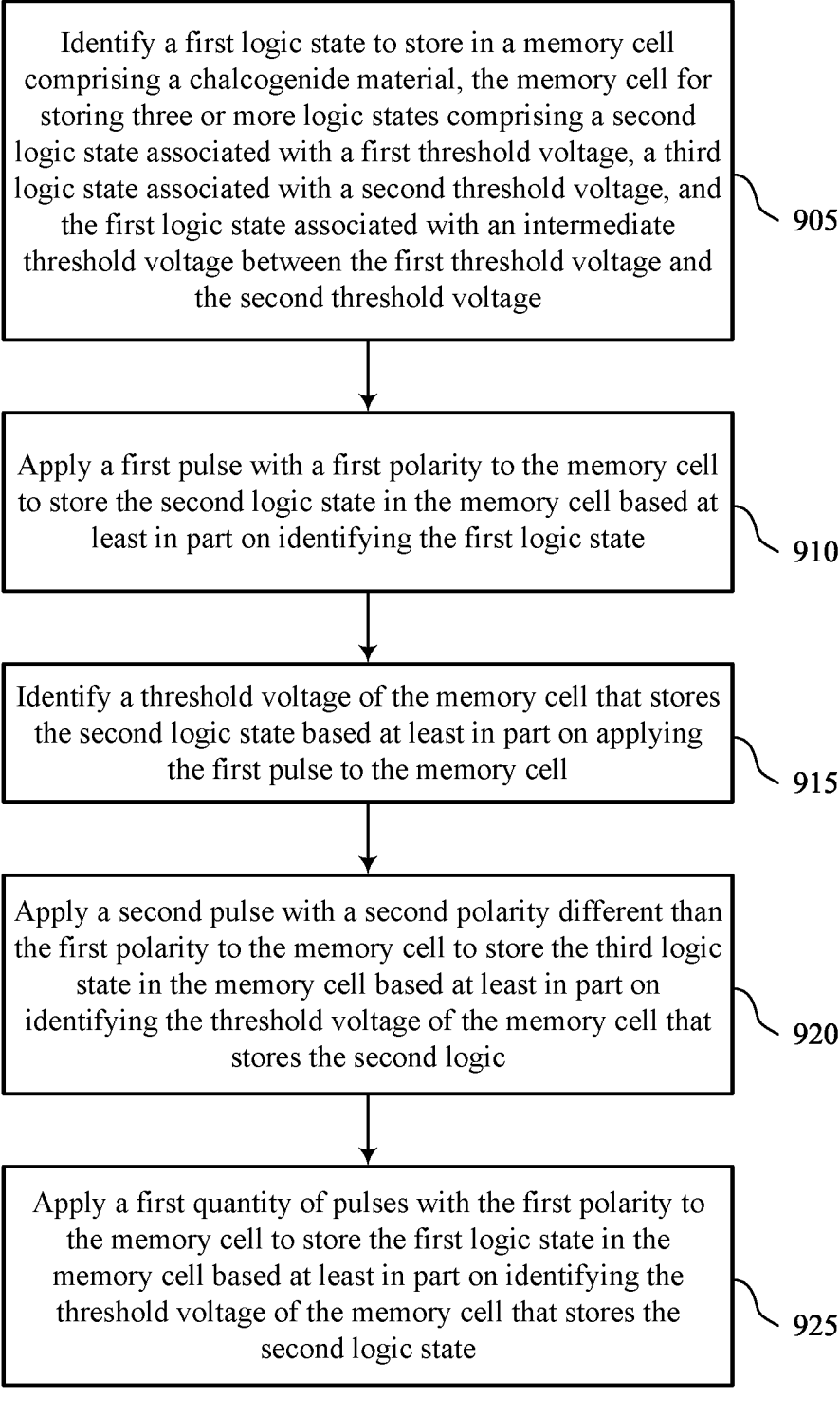

Identify a first logic state to store in a memory cell comprising a chalcogenide material, the memory cell for storing three or more logic states comprising a second logic state associated with a first threshold voltage, a third logic state associated with a second threshold voltage, and the first logic state associated with an intermediate threshold voltage between the first threshold voltage and the second threshold voltage

905

Apply a first pulse with a first polarity to the memory cell to store the second logic state in the memory cell based at least in part on identifying the first logic state

910

Identify a threshold voltage of the memory cell that stores the second logic state based at least in part on applying the first pulse to the memory cell

915

Apply a second pulse with a second polarity different than the first polarity to the memory cell to store the third logic state in the memory cell based at least in part on identifying the threshold voltage of the memory cell that stores the second logic

920

Apply a first quantity of pulses with the first polarity to the memory cell to store the first logic state in the memory cell based at least in part on identifying the threshold voltage of the memory cell that stores the second logic state

PULSE BASED MULTI-LEVEL CELL PROGRAMMING

CROSS REFERENCE

The present Application for Patent is a continuation of U.S. patent application Ser. No. 17/740,069 by Castro, et al., entitled "PULSE BASED MULTI-LEVEL CELL PROGRAMMING", filed May 9, 2022, which is assigned to the assignee hereof, and is expressly incorporated by reference in its entirety herein.

FIELD OF TECHNOLOGY

The following relates to one or more systems for memory, including pulse based multi-level cell programming.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIGS. 8 and 9 show flowcharts illustrating a method or methods that support pulse based multi-level cell programming in accordance with examples as disclosed herein.

DETAILED DESCRIPTION

Figure 1:
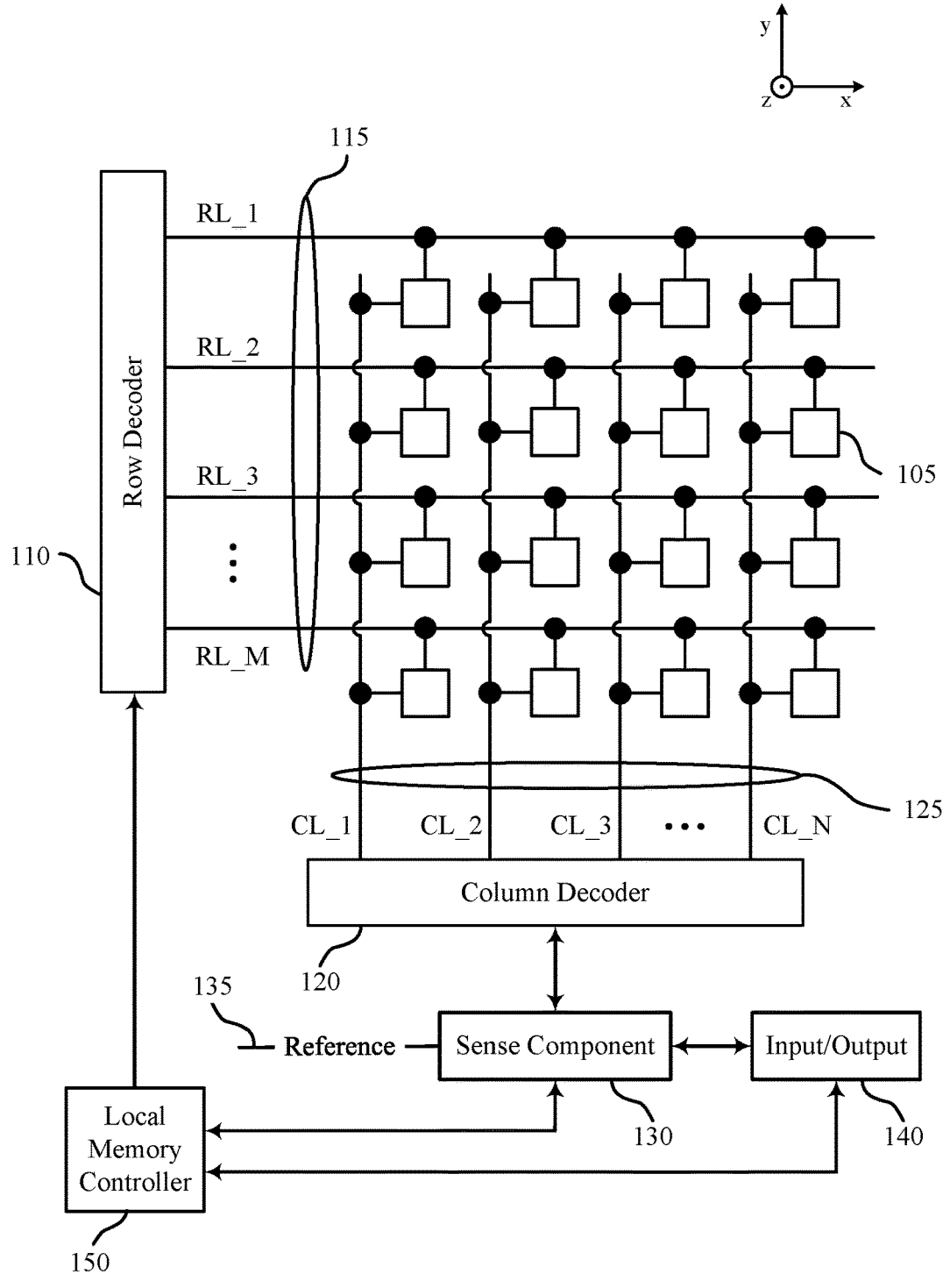
FIG. 1 illustrates an example of a memory array that supports pulse based multi-level cell programming in accordance with examples as disclosed herein.

A memory cell that includes a chalcogenide material may be an example of a multi-level cell that is configured to store three or more states. As such, a single multi-level memory cell may be configured to store more than one bit of data. In some cases, a multi-level memory cell may be selected by applying a bias between a word line and a bit line. The logic state that is stored in a multi-level memory cell may be based on a polarity of a programming pulse applied to the multi-level memory cell. For some multi-level memory cells, to program one or more intermediate memory states to the multi-level memory cell, a programming pulse sequence that includes multiple pulses. A first pulse of the programming pulse sequence may have a first polarity and a first magnitude, and the second pulse of the programming pulse sequence may have a second polarity different than the first polarity and a second magnitude different than the first magnitude. After applying both pulses in the programming pulse sequence, the multi-level memory cell may store an intermediate state that represents two bits of data (e.g., a logic 01 or a logic 10). In some cases, however, each logic state stored in a given multi-level memory cell may have a distribution of threshold voltages. For example, a first multi-level memory cell storing a state that corresponds to the state '11' may have a greater threshold voltage (e.g., a high threshold voltage memory cell) than a threshold voltage of a second multi-level memory cell that stores the state that corresponds to the state '11' (e.g., a mid or low threshold voltage memory cell). In some examples, as a standard deviation between a set of threshold voltages for a set of memory cells storing the same digital logic state increases, complexity associated with the programming pulse sequence may also increase, introducing latency into the system and reducing a read budget window associated with the set of multi-level cells.

Accordingly, a memory device may account for deviations in threshold voltages between a set of memory cells storing the same digital logic state by implementing techniques for pulse based multi-level cell programming as described herein. For example, the memory device may apply a first pulse to a multi-level cell to write a first state to the multi-level cell (e.g., either a RESET state or SET state). As such, the memory device may apply a ramping voltage to the multi-level cell to identify the threshold voltage of the multi-level cell that stores a particular state. Based on the voltage threshold state, the memory device may identify and apply a first quantity of one or more pulses to the multi-level cell to write an intended intermediate state to the multi-level memory cell. In some examples, the memory device may apply a differing first quantity of pulses to a first multi-level memory cell and a second multi-level memory cell based on their respective threshold voltages of the different memory cells that store the same state. In some examples, the first pulse and the first quantity of one or more pulses may have different polarities. In some examples, a pulse amplitude and pulse width associated with the first quantity of pulses for a given multi-level cell may be based on the associated threshold voltage for the first state.

Features of the disclosure are initially described in the context of memory devices and arrays with reference to FIGS. 1, 2, 3A, and 3B. Features of the disclosure are described in the context of diagrams and systems with reference to FIGS. 4 through 6. These and other features of the disclosure are further illustrated by and described with reference to an apparatus diagram and flowcharts that relate to pulse based multi-level cell programming as described with reference to FIGS. 7 through 9.

FIG. 1 illustrates an example of a memory device 100 that supports pulse based multi-level cell programming in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide material may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples, (e.g., for thresholding memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, thresholding memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory cell 105.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes, tiers) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

In examples where the memory cells 105 may be examples of multi-level memory cells 105 an intermediate state may be stored to a memory cell 105 using one or more pulses of one or more polarities. A multi-level memory cell may be configured to store three or more states. Each state capable of being stored by the memory cell may be mapped to digital logic states (e.g., for two bits of data the digital logic states may include 00, 01, 10, 11). An intermediate state may refer to a state of the memory cell that less than a first state capable of being stored by the memory cell and more than a second state capable of being stored by the memory cell. For example, a first state may be associated with a first voltage threshold, the intermediate state may be associated with a second voltage threshold, and the second state may be associated with a third voltage threshold. In such an example, the first voltage threshold may be greater than the second voltage threshold and the second voltage threshold may be greater than the third voltage threshold. Any quantity of intermediate states may be capable of being stored by a multi-level memory cell.

In some examples, the intermediate states may have a smaller margin of threshold voltages that can be stored without introducing errors into the data, as compared to boundary states (e.g., the first state and the second state). Each state stored by a memory cell may be associated with a distribution of voltage thresholds. Meaning a first memory cell storing a first state may have a different voltage threshold than a second memory cell that also stores the first state. This may occur due to manufacturing variations or other variations between memory cells and circuits associated with the memory device. As such, as a standard deviation increase between a set of threshold voltages for a set of memory cells 105, complexity associated with a programming pulse to write a same intermediate memory state to each memory cell 105 may also increase. In some examples, this increase in complexity may introducing latency into the system and reducing a read budget window associated with the set of memory cells 105.

Accordingly, the memory device 100 may account for deviations in threshold voltages for a set of memory cells 105 that store a certain state by implementing techniques for pulse-based multi-level cell programming. For example, the memory device 100 may apply a first pulse to a first memory cell 105 to write a first state to the memory cell 105 (e.g., either a RESET state or SET state). As such, the memory device 100 may apply a ramping voltage to the memory cell 105 to identify an associated threshold voltage that stores the first state for the memory cell 105. Based on the specific voltage threshold state of the memory cell that stores the first state, the memory device may identify (e.g., via a configured look-up table) and apply a first quantity of one or more pulses to the memory cell 105 to write an intended intermediate state to the multi-level memory cell 105. In some examples, the memory device 100 may apply a differing first quantity of pulses to a first multi-level memory cell 105 and a second multi-level memory cell 105 based on their respective threshold voltages in the first state. In some examples, the first pulse and the first quantity of one or more pulses may have different polarities. In some examples, a pulse amplitude and pulse width associated with the first quantity of pulses for a given memory cell 105 may be based on the associated threshold voltage for the first state.

The memory device 100 may include any quantity of non-transitory computer readable media that support pulse based multi-level cell programming. For example, a local memory controller 150, a row decoder 110, a column decoder 120, a sense component 130, or an input/output component 140, or any combination thereof may include or may access one or more non-transitory computer readable media storing instructions (e.g., firmware) for performing the functions ascribed herein to the memory device 100. For example, such instructions, if executed by the memory device 100, may cause the memory device 100 to perform one or more associated functions as described herein.

Figure 2:
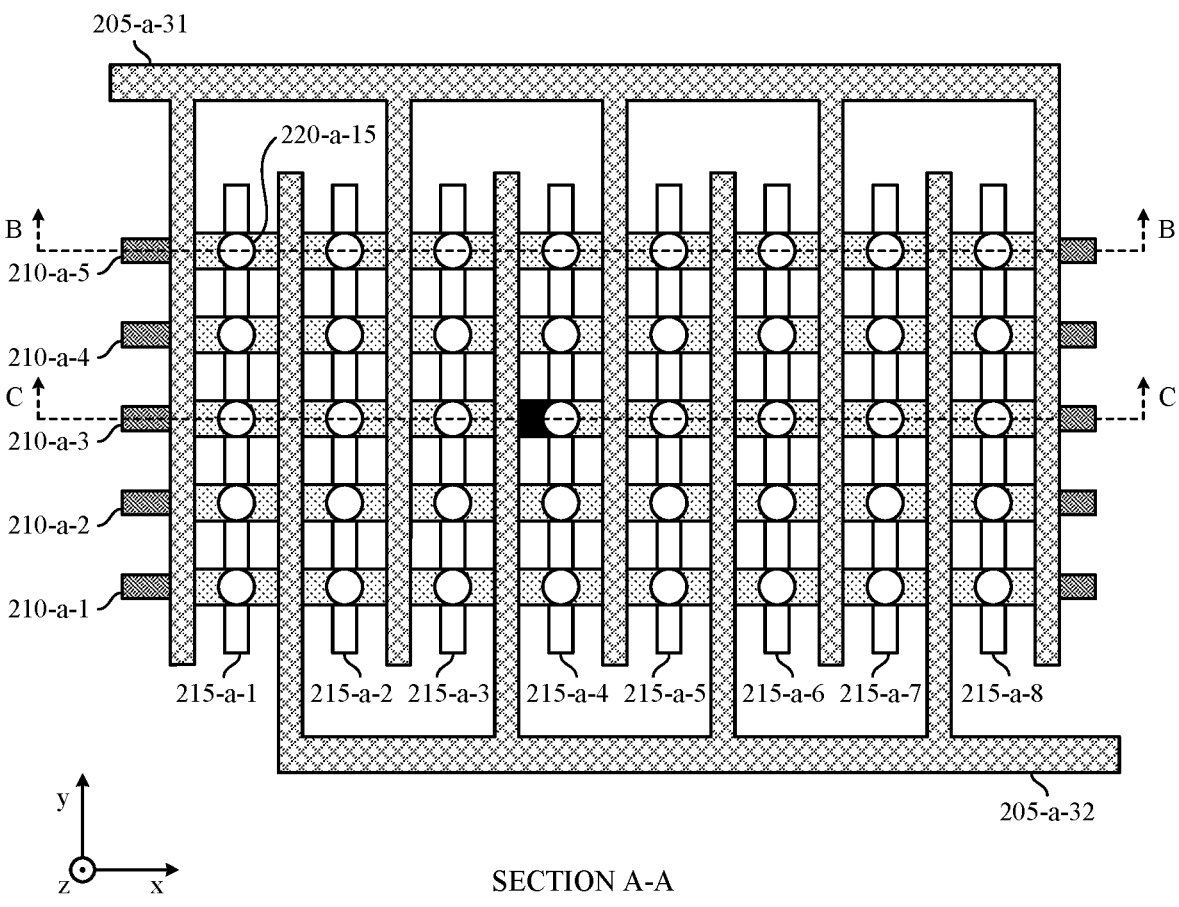
FIG. 2 illustrates a top view of an example of a memory array that supports pulse based multi-level cell programming in accordance with examples as disclosed herein.
Figure 3A:
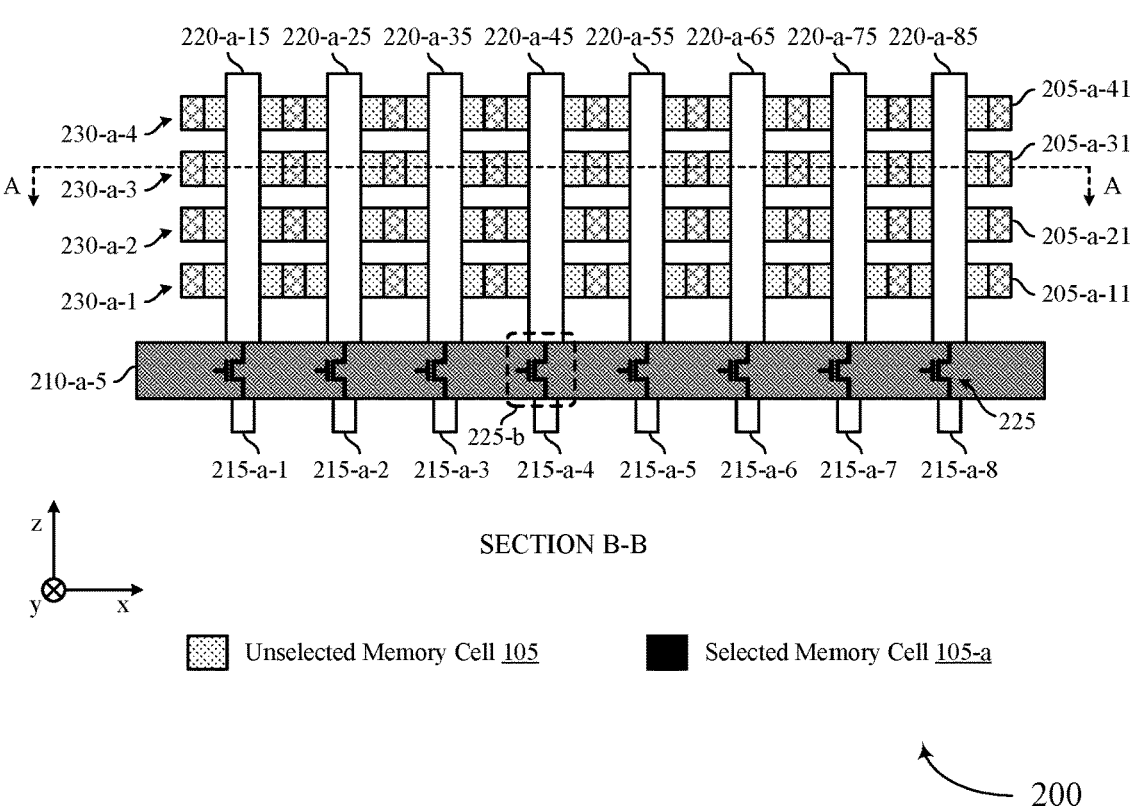
FIGS. 3A and 3B illustrate side views of an example of a memory array that supports pulse based multi-level cell programming in accordance with examples as disclosed herein.
Figure 3B:
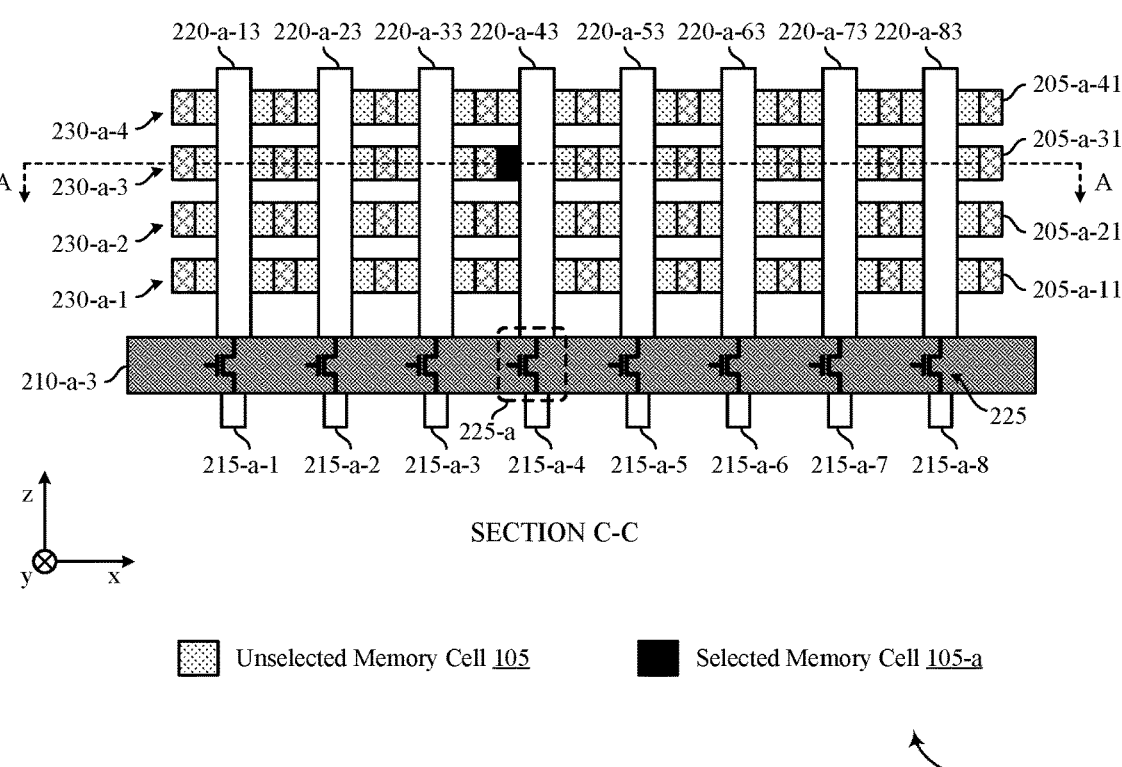

FIGS. 2, 3A, and 3B illustrate an example of a memory array 200 that supports pulse based multi-level cell programming in accordance with examples as disclosed herein. The memory array 200 may be included in a memory device 100, and illustrates an example of a three-dimensional arrangement of memory cells 105 that may be accessed by various conductive structures (e.g., access lines). FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C) of the memory array 200 relative to a cut plane C-C as shown in FIG. 2. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, planes, tiers, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four levels 230, a memory array 200 in accordance with examples as disclosed herein may include any quantity of one or more levels 230 (e.g., 64 levels, 128 levels) along the z-direction.

Each word line 205 may be an example of a portion of an access line that is formed by one or more conductive materials (e.g., one or more metal portions, one or more metal alloy portions). As illustrated, a word line 205 may be formed in a comb structure, including portions (e.g., projections, tines) extending along the y-direction through gaps (e.g., alternating gaps) between pillars 220. For example, as illustrated, the memory array 200, may include two word lines 205 per level 230 (e.g., according to odd word lines 205-a-n1 and even word lines 205-a-n2 for a given level, n), where such word lines 205 of the same level 230 may be described as being interleaved (e.g., with portions of an odd word line 205-a-n1 projecting along the y-direction between portions of an even word line 205-a-n2, and vice versa). In some examples, an odd word line 205 (e.g., of a level 230) may be associated with a first memory cell 105 on a first side (e.g., along the x-direction) of a given pillar 220 and an even word line (e.g., of the same level 230) may be associated with a second memory cell 105 on a second side (e.g., along the x-direction, opposite the first memory cell 105) of the given pillar 220. Thus, in some examples, memory cells 105 of a given level 230 may be addressed (e.g., selected, activated) in accordance with an even word line 205 or an odd word line 205.

Each pillar 220 may be an example of a portion of an access line (e.g., a conductive pillar portion) that is formed by one or more conductive materials (e.g., one or more metal portions, one or more metal alloy portions). As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 205 (e.g., a level selection, which may include an even or odd selection within a level 230) and a pillar 220. For example, as illustrated, a selected memory cell 105-a of the level 230-a-3 may be accessed according to an intersection between the pillar 220-a-43 and the word line 205-a-32.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line 205 with a first voltage (e.g., $V_{access}/2$) and by biasing a selected pillar 220 with a second voltage (e.g., $-V_{access}/2$), which may have an opposite sign relative to the first voltage. Regarding the selected memory cell 105-a, a corresponding access bias (e.g., the first voltage) may be applied to the word line 205-a-32, while other unselected word lines 205 may be grounded (e.g., biased to 0V). In some examples, a word line bias may be provided by a word line driver (not shown) coupled with one or more of the word lines 205.

To apply a corresponding access bias (e.g., the second voltage) to a pillar 220, the pillars 220 may be configured to be selectively coupled with a sense line 215 (e.g., a digit line, a column line, an access line extending along the y-direction) via a respective transistor 225 coupled between (e.g., physically, electrically) the pillar 220 and the sense line 215. In some examples, the transistors 225 may be vertical transistors (e.g., transistors having a channel along the z-direction, transistors having a semiconductor junction along the z-direction), which may be formed above the substrate of the memory array 200 using various techniques (e.g., thin film techniques). In some examples, a selected pillar 220, a selected sense line 215, or a combination thereof may be an example of a selected column line 125 described with reference to FIG. 1 (e.g., a bit line).

The transistors 225 (e.g., a channel portion of the transistors 225) may be activated by gate lines 210 (e.g., activation lines, selection lines, a row line, an access line extending along the x-direction) coupled with respective gates of a set of the transistors 225 (e.g., a set along the x-direction). In other words, each of the pillars 220 may have a first end (e.g., towards the negative z-direction, a bottom end) configured for coupling with an access line (e.g., a sense line 215). In some examples, the gate lines 210, the transistors 225, or both may be considered to be components of a row decoder 110 (e.g., as pillar decoder components). In some examples, the selection of (e.g., biasing of) pillars 220, or sense lines 215, or various combinations thereof, may be supported by a column decoder 120, or a sense component 130, or both.

To apply the corresponding access bias (e.g., $-V_{access}/2$) to the pillar 220-*a*-43, the sense line 215-*a*-4 may be biased with the access bias, and the gate line 210-*a*-3 may be grounded (e.g., biased to 0V) or otherwise biased with an activation voltage. In an example where the transistors 225 are n-type transistors, the gate line 210-*a*-3 being biased with a voltage that is relatively higher than the sense line 215-*a*-4 may activate the transistor 225-*a* (e.g., cause the transistor 225-*a* to operate in a conducting state), thereby coupling the pillar 220-*a*-43 with the sense line 215-*a*-4 and biasing the pillar 220-*a*-43 with the associated access bias. However, the transistors 225 may include different channel types, or may be operated in accordance with different biasing schemes, to support various access operations.

In some examples, unselected pillars 220 of the memory array 200 may be electrically floating when the transistor 225-*a* is activated, or may be coupled with another voltage source (e.g., grounded, via a high-resistance path, via a leakage path) to avoid a voltage drift of the pillars 220. For example, a ground voltage being applied to the gate line 210-*a*-3 may not activate other transistors coupled with the gate line 210-*a*-3, because the ground voltage of the gate line 210-*a*-3 may not be greater than the voltage of the other sense lines 215 (e.g., which may be biased with a ground voltage or may be floating). Further, other unselected gate lines 210, including gate line 210-*a*-5 as shown in FIG. 3A, may be biased with a voltage equal to or similar to an access bias (e.g., $-V_{access}/2$, or some other negative bias or bias relatively near the access bias voltage), such that transistors 225 along an unselected gate line 210 are not activated. Thus, the transistor 225-*b* coupled with the gate line 210-*a*-5 may be deactivated (e.g., operating in a non-conductive state), thereby isolating the voltage of the sense line 215-*a*-4 from the pillar 220-*a*-45, among other pillars 220.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0.

Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 0) to threshold (e.g., permit a current flow, permit a current above a threshold current), and may not cause a memory cell 105 storing a second logic state (e.g., a logic 1) to threshold (e.g., may not permit a current flow, may permit a current below a threshold current).

In examples where the memory cells 105 may be examples of multi-level memory cells 105 an intermediate state (e.g., 01 or 10) may be stored to the selected memory cell 105-*a* using one or more pulses of one or more polarities. In some examples, the intermediate states may have a reduced associated threshold voltage distribution (e.g., sigma value) compared to boundary logic states (e.g., 00 and 11). As such, as a standard deviation increase between a set of threshold voltages for a set of memory cells 105, complexity associated with a programming pulse to write a same intermediate memory state to each selected memory cell 105-*a* may also increase. In some examples, this increase in complexity may introducing latency into the system and reducing a read budget window associated with the set of memory cells 105.

Accordingly, the memory array 200 may account for deviations in threshold voltages for a set of memory cells 105 by implementing techniques for pulse based multi-level cell programming. For example, the memory array 200 may apply a first pulse to a first selected memory cell 105-*a* to write a first state to the selected memory cell 105-*a* (e.g., either a RESET state or SET state). As such, the memory array 200 may apply a ramping voltage to the selected memory cell 105-*a* to identify an associated threshold voltage that stores the first state for the selected memory cell 105-*a*. Based on the voltage threshold state, the memory device may identify (e.g., via a configured look-up table) and apply a first quantity of one or more pulses to the selected memory cell 105-*a* to write an intended intermediate state to the selected memory cell 105-*a*. In some examples, the memory array 200 may apply a differing first quantity of pulses to a first multi-level memory cell 105 and a second multi-level memory cell 105 based on their respective threshold voltages in the first state. In some examples, the first pulse and the first quantity of one or more pulses may have different polarities. In some examples, a pulse amplitude and pulse width associated with the first quantity of pulses for a given memory cell 105 may be based on the associated threshold voltage for the first state.

Figure 4:
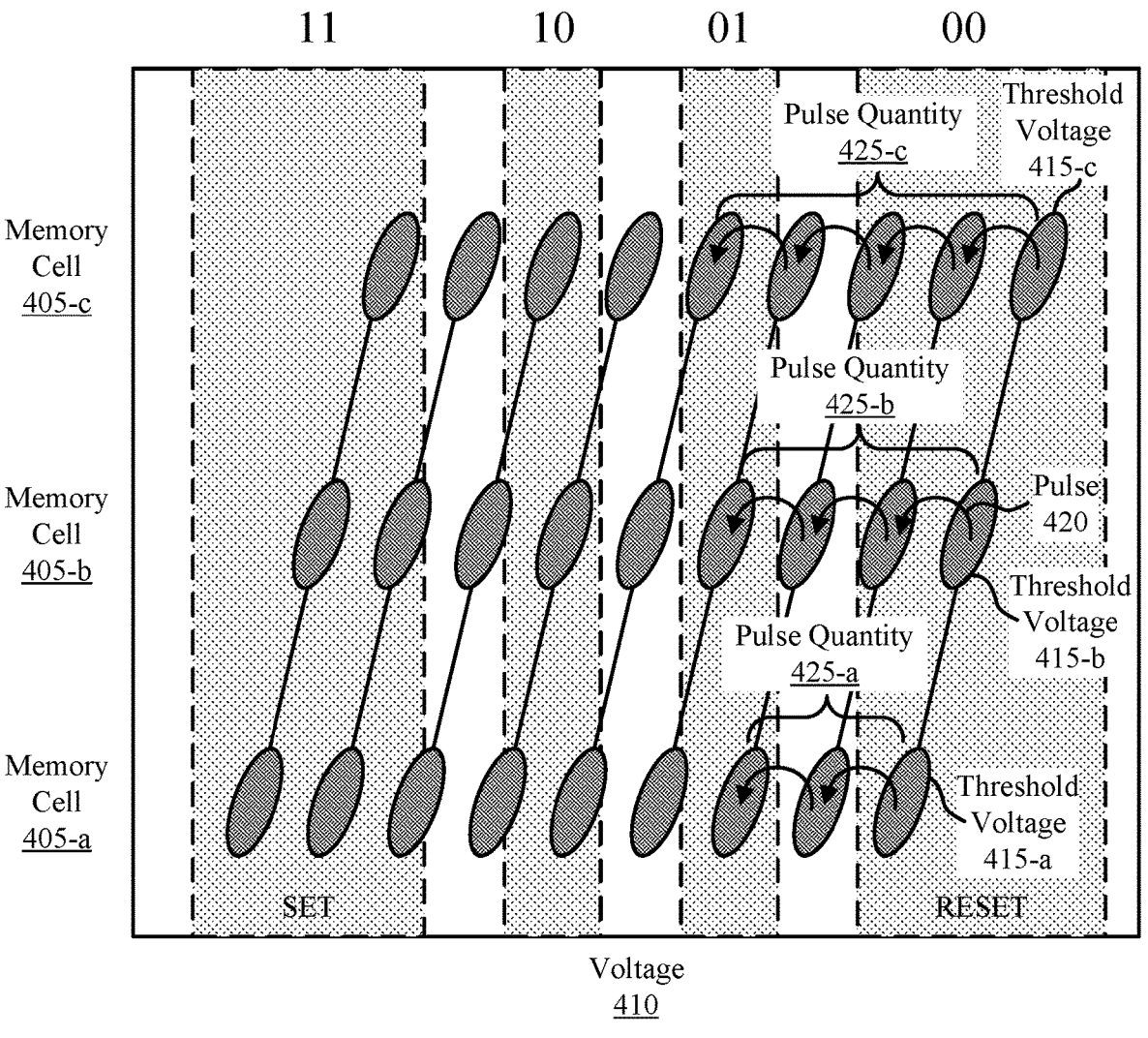
FIG. 4 illustrates an example of a diagram that supports pulse based multi-level cell programming in accordance with examples as disclosed herein.

FIG. 4 illustrates an example of a diagram 400 that supports pulse based multi-level cell programming in accordance with examples as disclosed herein. In some examples, diagram 400 may implement aspects in of memory device 100, memory array 200, or a combination thereof. For example, the memory cells 405 may be examples of memory cells 105 with reference to FIGS. 1 through 3. A multi-level memory cell 405 may be configured to store a memory state that represents multiple bits of data using multi-level storage techniques. The voltage distributions depict memory states that may be read. In some examples, the diagram 400 may depict programming of the multi-level memory cells 405 using an adaptive programming algorithm that considers a SET and RESET threshold voltage correlation for each memory cell 405 and the capability for programming more than one voltage 410 level for a given memory state.

As illustrated in FIG. 4, each memory cell 405 (e.g., memory cell 405-*a*, memory cell 405-*b*, and memory cell 405-*c*) may be associated with a respective threshold voltage 415 for a given memory state. The memory cell 405-*a* may have a threshold voltage 415 associated with memory state 00 (e.g., RESET state). The threshold voltage 415 be one of a range of threshold voltages that can be associated with the memory state 00 (e.g., RESET state). Due to variations in memory cells and circuits, some variations in threshold voltages can exist between memory cells storing the same memory state. Such distributions of voltage thresholds may reduce a read window budget for sensing the state of memory cells. Thus, it may be advantageous to reduce variations in voltage thresholds of memory cells that store the same memory state. For example, the memory cell 405-*a* may store the memory state 00 (e.g., RESET state) and have the voltage threshold 415-*a* and the memory cell 405-*b* may also store the memory state 00 (e.g., RESET state and have the voltage threshold 415-*b*. Additionally, or alternatively, the memory cell 405-*c* that stores memory state 00 (e.g., RESET state) may have a threshold voltage 415-*c* that is on the right edge of the voltage 410 boundary associated with the memory state (e.g., a high threshold voltage 415 memory cell). As such, each memory state for the set of memory cells 405 may reside over a threshold voltage 415 distribution, in which a range of threshold voltages 415 may be associated with the respective memory state. The distributions for each memory state may correspond to distributions formed using a write pulse having a positive or negative polarity and read using a read pulse having the positive or negative polarity. While FIG. 4 illustrates three memory cells 405 associated with differing threshold voltages 415, it is understood that a memory system may be associated with any number of memory cells 405 associated with any number of differing threshold voltages 415 for a given memory state.

In examples where a set memory cells 405 are associated with two memory states (e.g., 0 or 1), a memory system may utilize a same pulse 420 (e.g., a blind application of a pulse 420) to write a same memory state to various memory cells 405 despite the various memory cells 405 being associated with differing threshold voltages 415. This may be cause the read window budget associated with the two memory states is big enough that the voltage threshold distributions of the two states do not overlap. When the voltage threshold distributions between memory states overlap, errors can occur when reading the data from the memory cells. For example, a memory device may interpret a cell as a first state during the read operation, but the intended state may be a second state. In some examples, the memory system may apply a pulse 420 by applying a first voltage to a word line associated with a memory cell 405 and applying a second voltage that is different from the first voltage to a digit line associated with the memory cell 405.

In some cases, however, where a memory cell 405 is associated with three or more memory states (e.g., as illustrated in FIG. 4) a deviation in threshold voltages 415 for each memory cell 405 may introduce error in writing or reading a same intermediate memory state to each memory cell 405 using a same pulse 420. For example, a blind pulse 420 applied to memory cell 405-*c* that writes the memory state of 01 to the memory cell 405-*c* may write a memory state 10 to the memory cell 405-*a*. Additionally, or alternatively, a blind pulse 420 applied to memory cell 405-*a* that writes the memory state of 01 to the memory cell 405-*a* may keep the memory cell 405-*c* in the threshold voltage 415 distribution associated with state 00. In some examples, the threshold voltage 415 distribution associated with the intermediate memory states may be smaller (e.g., a tighter sigma value) compared to the SET and RESET states, further increasing the complexity of programming multiple memory cells 405 with a same intermediate state. As such, the memory system may be unable to use a same blind pulse 420 to write a same intermediate memory state (e.g., 01 or 10) to the memory cells 405-*a* through 405-*c* without increasing a likelihood of introducing errors into the stored data.

Accordingly, the memory system may detect a threshold voltage 415 associated with a given memory cell 405 and identify a quantity of pulses 420 to apply to the given memory cell 405 to write an intended intermediate memory state as described herein. For example, as illustrated in FIG. 4, the memory system may determine to write the intermediate memory state 01 to each of memory cells 405-*a* through 405-*c*. As such, the memory system may perform an initial preconditioning state. In some examples, if a read pulse for the system has a negative polarity, the memory system may perform a SET precondition in which the memory system uses a negative write pulse to write the memory state 00 to the given memory cell 405. In such examples, the memory system may determine a threshold voltage 415 associated with the given memory cell 405 in the SET precondition. In some instances, the memory system may determine the threshold voltage 415 by using a voltage ramp and a set of latches as described herein with reference to FIG. 5. Based on determining the threshold voltage 415 for the memory cell 405 in the SET precondition, the memory system may perform a blind RESET program (e.g., use a positive write pulse) to transition the given memory cell 405 to the memory state 11 (e.g., the RESET state). The SET precondition and the threshold voltage 415 determination may be used to determine the respective locations (e.g., the voltage 410) of each memory cell 405 within the SET distribution, which may introduce a degree of adaptivity to be employed when writing the intended intermediate memory state for the memory cells 405.

Additionally, or alternatively, if the read pulse for the system has a positive polarity, the memory system may perform a RESET precondition in which the memory system uses a positive write pulse to write the memory state 11 to the given memory cell 405. In such examples, the memory system may determine a threshold voltage 415 associated with the given memory cell 405 in the RESET precondition. In some instances, the memory system may determine the threshold voltage 415 based on using a voltage ramp and a set of latches as described herein with reference to FIG. 5. In cases where the memory system uses a positive read polarity, the memory system may be configured with a sense amplifier configured in accordance with the positive read polarity. The RESET precondition may avoid a change in polarity between the first state precondition (to detect the threshold voltage), and the second pulse precondition before writing the intermediate memory state to a memory cell 405.

As such, the memory system may determine a pulse quantity 425 (e.g., a number of pulses) to apply to a given memory cell 405 to write the intended intermediate state to the memory cell 405 (e.g., state 01 as illustrated in FIG. 4). In some examples, the memory system may determine the pulse quantity 425 for each respective memory cell 405 based on determining the threshold voltage 415 associated with each respective memory cell 405. For example, the memory system may use an associated comparator component (e.g., a look-up table) that relates the threshold voltage 415 of a memory cell 405 to a pulse quantity 425 for a given intermediate memory state. For instance, to write the memory state 01 to each memory cell 405 with reference to FIG. 4, the threshold voltage 415 for memory cell 405-a may be associated with a pulse quantity 425-a (e.g., 2 pulses 420), the threshold voltage 415 for memory cell 405-b may be associated with a pulse quantity 425-b (e.g., 3 pulses 420), and the threshold voltage 415 for memory cell 405-c may be associated with a pulse quantity 425-c (e.g., 4 pulses 420). In some cases, respective sets of threshold voltages 415 may be associated with a respective pulse quantity 425 to write an intended intermediate state to a memory cell 405. Additionally, or alternatively, the memory system may optionally verify the intermediate memory state of each memory cell 405 after applying the respective pulse quantity 425. In some examples, the memory system may refrain from verifying the intermediate state to increase the write throughput of each memory cell 405. In some examples, the memory system may verify the intermediate state to further evaluate threshold voltage distributions associated with the memory cells 405.

In some examples, the comparator component associated with the memory system may also indicate one or more characteristics associated with each pulse 420 of a given pulse quantity 425 based on the associated threshold voltage 415 for a given memory cell 405. For example, for each pulse 420 of a pulse quantity 425, the comparator may indicate voltage or current pulse amplitude (e.g., V/I PA), a pulse width (e.g., PW), or a combination thereof. In some instances, each pulse 420 of a pulse quantity 425 may have the same voltage or current amplitude, the same pulse 420 width, or both. Additionally, or alternatively, each pulse 420 of a pulse quantity 425 may have a different voltage or current amplitude, a different pulse width, or both. In some examples, pulses 420 used for a higher threshold voltage memory cell 405 (e.g., the memory cell 405-c) may have a higher voltage or current pulse amplitude, a longer pulse width, or both. In some examples, pulses 420 used for a lower threshold voltage memory cell 405 (e.g., the memory cell 405-a) may have a lower voltage or current pulse amplitude, a shorter pulse width, or both. In some examples, the memory cell 405 may a apply the pulses 420 to each memory cell 405 using the same voltage or current pulse amplitude, the same pulse width, or both. Further discussion of the comparator component is described herein, including with reference to FIG. 6.

As illustrated in FIG. 4, each memory cell 405 may benefit from a defined relationship between threshold voltages 415 for SET and RESET (e.g., the voltage difference between the threshold voltage 415 for SET and the threshold voltage 415 for RESET for each memory cell 405 may be similar). This defined relationship may allow the memory system to determine (e.g., measure) a threshold voltage 415 for a memory cell 405 in a first memory state (e.g., using the SET or RESET precondition) and utilize the relative voltage position between SET and RESET to apply a pulse quantity 425 to reach an intended intermediate memory state. By using a pulse quantity 425, the memory system may position the voltage threshold of the memory state more precisely that is done using a blind programming pulse. This may improve the read window budget for the intermediate states and may reduce a likelihood of errors occurring when reading the multi-level memory cell. Adaptive memory cell 405 programming may also allow for tighter voltage 410 distributions associated with the intermediate memory states (e.g., based on identifying a threshold voltage 415 associated with each memory cell 405.

In accordance with the SET preconditioning procedure, the memory system may preform one or more of the following processes. For example, the memory system may identify for a memory cell 405 an intended logic state (e.g., either 10 or 01) associated with an intermediate threshold voltage 415. As such, the memory system may apply a first pulse 420 with a negative polarity to the memory cell 405 to store the 11 logic state in accordance with the SET preconditioning procedure. The memory system may then identify the threshold voltage 415 of the memory cell 405 that stores the intermediate logic state based on applying the negative pulse to the memory cell 405. The memory system may then apply a second pulse 420 with a positive polarity to the memory cell 405 to store the 00 logic state in the memory cell 405 based on identifying the threshold voltage 415 of the memory cell 405 that stores the intermediate logic state. The memory system may then apply a pulse quantity 425 with a negative polarity to the memory cell 405 to store the intermediate logic state in the memory cell 405 based on identifying the threshold voltage 415 of the memory cell 405 that stores the intermediate logic state.

In accordance with the RESET preconditioning procedure, the memory system may preform one or more of the following processes. For example, the memory system may identify for a memory cell 405 an intended logic state (e.g., either 10 or 01) associated with an intermediate threshold voltage 415. As such, the memory system may apply a first pulse 420 with a positive polarity to the memory cell 405 to store the 00 logic state in accordance with the RESET preconditioning procedure. The memory system may then identify the threshold voltage 415 of the memory cell 405 that stores the intermediate logic state based on applying the positive pulse 420 to the memory cell 405. The memory system may then apply a first pulse quantity 425 with a negative polarity to the memory cell 405 to store the intermediate logic state in the memory cell 405 based on identifying the threshold voltage 415 of the memory cell 405 that stores the intermediate logic state.

Figure 5:
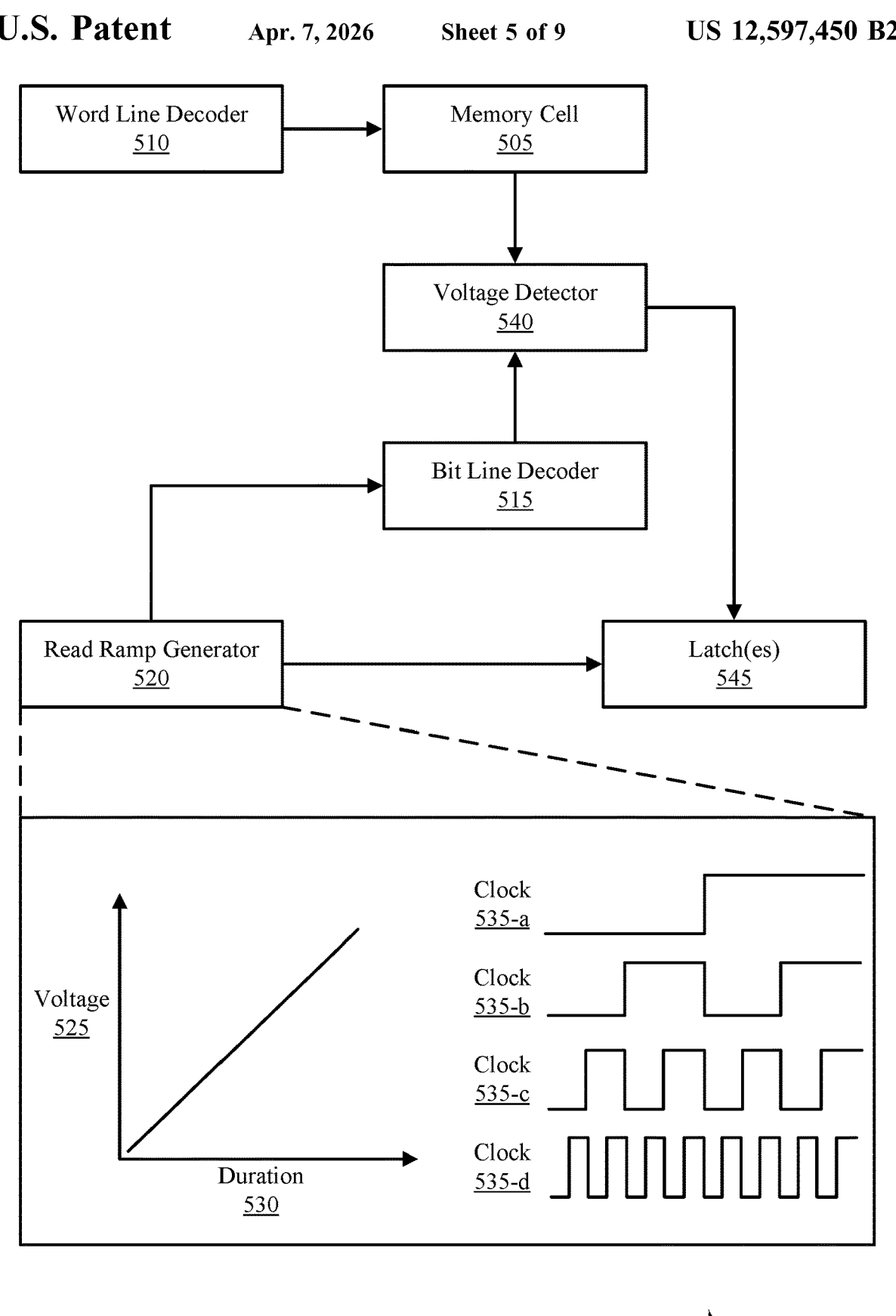
FIG. 5 illustrates an example of a system that supports pulse based multi-level cell programming in accordance with examples as disclosed herein.

FIG. 5 illustrates an example of a system 500 that supports pulse based multi-level cell programming in accordance with examples as disclosed herein. In some examples, system 500 may implement aspects in of memory device 100, memory array 200, diagram 400, or a combination thereof. For example, the memory cell 505 may be an example of memory cells 105 with reference to FIGS. 1 through 3 or memory cells 405 with reference to FIG. 4. The system 500 may use a read ramp generator 520, and one or more latches 545 to identify a threshold voltage (e.g., a threshold voltage 415 with reference to FIG. 4) for the memory cell 505.

As illustrated in FIG. 5, the memory cell 505 may be coupled with a word line decoder 510 and a bit line decoder 515. In some examples, the word line decoder 510 and the bit line decoder 515 may be examples of a row decoder 110, a column decoder 120, or a combination thereof as described with reference to FIG. 1. As such, the system 500 may use the word line decoder 510 and the bit line decoder 515 to select the memory cell 505 for a threshold voltage detection occasion. While FIG. 4 illustrates a single memory cell 505, it is understood the system 500 may use the word line decoder 510 and the bit line decoder to select any number of memory cells 505.

In some examples, the system 500 may perform the threshold voltage detection on the memory cell 505 by using a read ramp generator 520 to transmit a readout voltage ramp to the memory cell 505 via the bit line decoder 515. In some other implementations, the read ramp generator 520 may transmit the readout voltage ramp to the word line decoder 510. As illustrated in FIG. 5, the readout voltage ramp may increase a voltage 525 induced on the memory cell 505 over a duration 530. In some examples, the readout voltage ramp may also be associated with one or more clock signals 535 that are started in response to the ramping voltage being applied (e.g., clock 535-*a*, clock 535-*b*, clock 535-*c*, and clock 535-*d*). For example, each clock 535 may be coupled with an input of a respective latch 545 that may store the value of the respective clock 535. In some examples, the system 500 may initiate the one or more clocks 535 to the one or more latches 545 based on applying the ramping voltage. As such, a value of each latch 545 at a given duration 530 may correspond to a voltage 525 at the given duration 530.

In some cases, the memory cell 505 may also be coupled with a voltage detector 540 that may be operable to identify snapback event of the memory cell 505. In some examples, the memory cell 505 may experience a snapback event when the applied voltage differential across the memory cell 505 exceeds the threshold voltage associated with the memory cell 505 (e.g., the memory cell 505 snaps when it reaches the threshold voltage).

Based on identifying a snapback event at the memory cell 505, the voltage detector 540 may trigger the latches 545 to latch (e.g., store) the current value of the associated clock 535. As such, the latches 545 may store the value of the one or more clocks 535 in response to the memory cell 505 experiencing a snapback event based on applying the readout voltage ramp.

Based on storing the one or more clocks 535 in the one or more associated latches 545, the system 500 may identify the threshold voltage of the memory cell 505. In some examples, the system 500 may identify a respective threshold voltages for a set of memory cells 505 using the techniques described herein. In such examples, the system 500 may define a set of cell groups in a distribution where each cell group is associated with a range threshold voltages. As such, each memory cell 505 of the set of memory cells 505 may be categorized into a cell group of the set of cell groups associated with their threshold voltage. Additionally, or alternatively, the system 500 may generate a look-up-table associating each memory cell 505 of the set of memory cells 505 with a number of latches 545, where the latches 545 may represent a quantization of different cell groups with the distribution. Further descriptions for identifying the threshold voltage of the memory cell 505 and determining a pulse quantity (e.g., a pulse quantity 425 with reference to FIG. 4) to write an intended intermediate memory state to the memory cell 505 are described herein, including with reference to FIG. 6.

Figure 6:
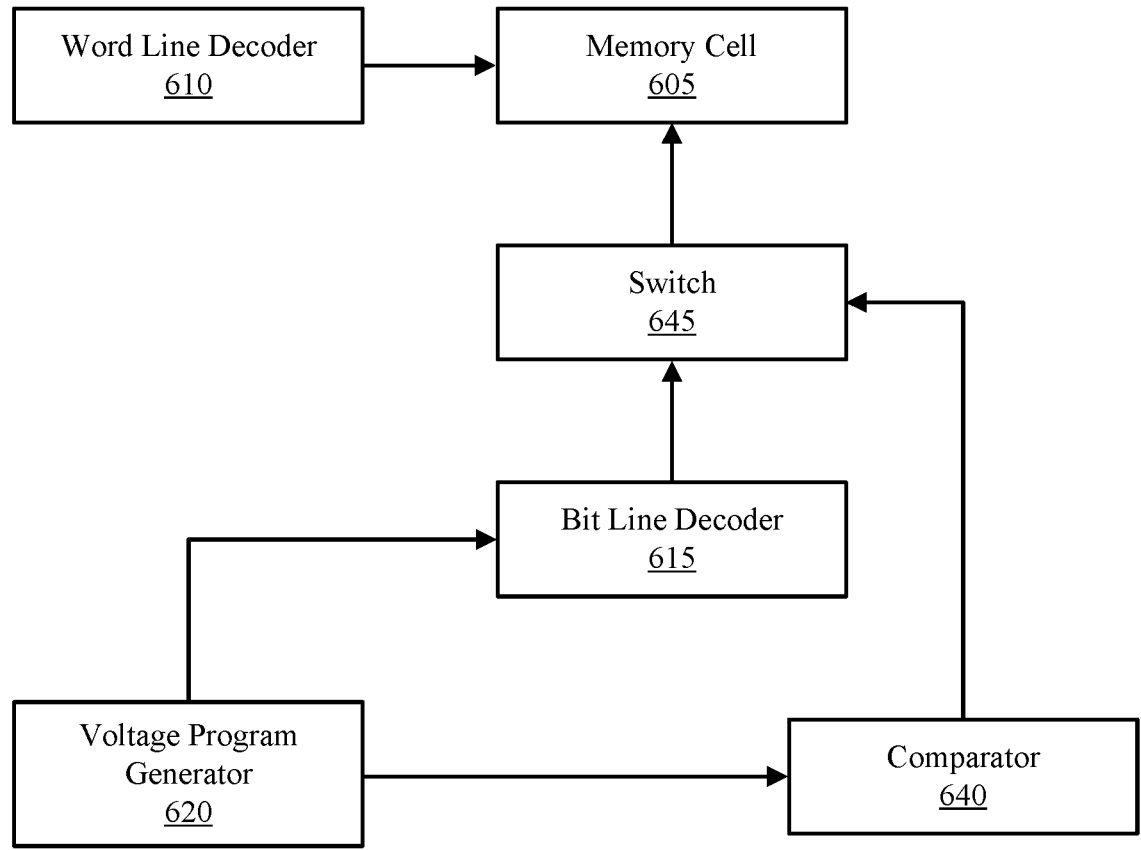
FIG. 6 illustrates an example of a system that supports pulse based multi-level cell programming in accordance with examples as disclosed herein.

FIG. 6 illustrates an example of a system 600 that supports pulse based multi-level cell programming in accordance with examples as disclosed herein. In some examples, system 600 may implement aspects in of memory device 100, memory array 200, diagram 400, system 500, or a combination thereof. For example, the memory cell 605 may be an example of memory cells 105 with reference to FIGS. 1 through 3, memory cells 405 with reference to FIG. 4, or memory cell 505 with reference to FIG. 5. Additionally, or alternatively, word line decoder 610 and bit line decoder 615 may be respective examples of the word line decoder 510 and the bit line decoder 515 as described with reference to FIG. 5. The system 600 may use a voltage program generator 620, a comparator 640, and a switch 645 to determine and apply a quantity of pulses to write an intended intermediate memory state to the memory cell 605 based on the identified threshold voltage of the memory cell 605.

As illustrated in FIG. 6, the system 600 may have an associated voltage program generator 620 that may generate a quantity of pulses to write an intended intermediate memory state to the memory cell 605. In some examples, the voltage program generator 620 may be coupled with the read ramp generator 520 and the latches 545 as described with reference to FIG. 5. In some examples, the voltage program generator 620 may receive an indication of the value of each latch 545 when the memory cell 605 experiences a snapback event.

In some examples, the system 600 may use the stored values of the latches for the memory cell 605 to identify a number of pulses to program an intended intermediate memory state to the memory cell 605. For instance, the voltage program generator 620 may be operable to transmit an indication of the values of the one or more latches to the comparator 640. Based on the value of the latches being associated with the threshold voltage of the memory cell 605, the comparator 640 may use the values of latches to identify a quantity of pulses. In some examples, the comparator 640 may use an associated look-up-table that associates the values of the latches with a quantity of pulses, where different values of the latches (e.g., different threshold voltages) may be associated with a different quantity of pulses. The quantity of pulses may also be based on the intended memory state of the memory cell 605. For example, a first set of values for latches may be associated with a first quantity of pulses to write the memory state 01 and a second quantity of pulses different from the first quantity to write the memory state 10. The look up table may also indicate a pulse amplitude and a pulse width for the quantity of pulse based on the identified threshold voltage of the memory cell 605.

Based on the comparator 640 identifying the quantity of pulses to write the intended intermediate memory state, the comparator 640 may transmit an indication of the quantity of pulses to a switch 645 of the system 600. In some examples, the switch 645 may be operable to close based on receiving the indication of the quantity of pulses from comparator 640. In some examples, a voltage program generator 620 of the system 600 may deliver the indicated quantity of pulses to the memory cell 605 to write the intended intermediate memory state based on the switch 645 closing. For instance, the voltage program generator 620 may transmit the quantity of pulses to the bit line decoder 615 which may then induce a voltage difference across the memory cell 605 based on the switch 645 closing. As such, the voltage difference across the memory cell 605 induced by the quantity of pulses may write the intended intermediate memory state to the memory cell 605.

Figure 7:
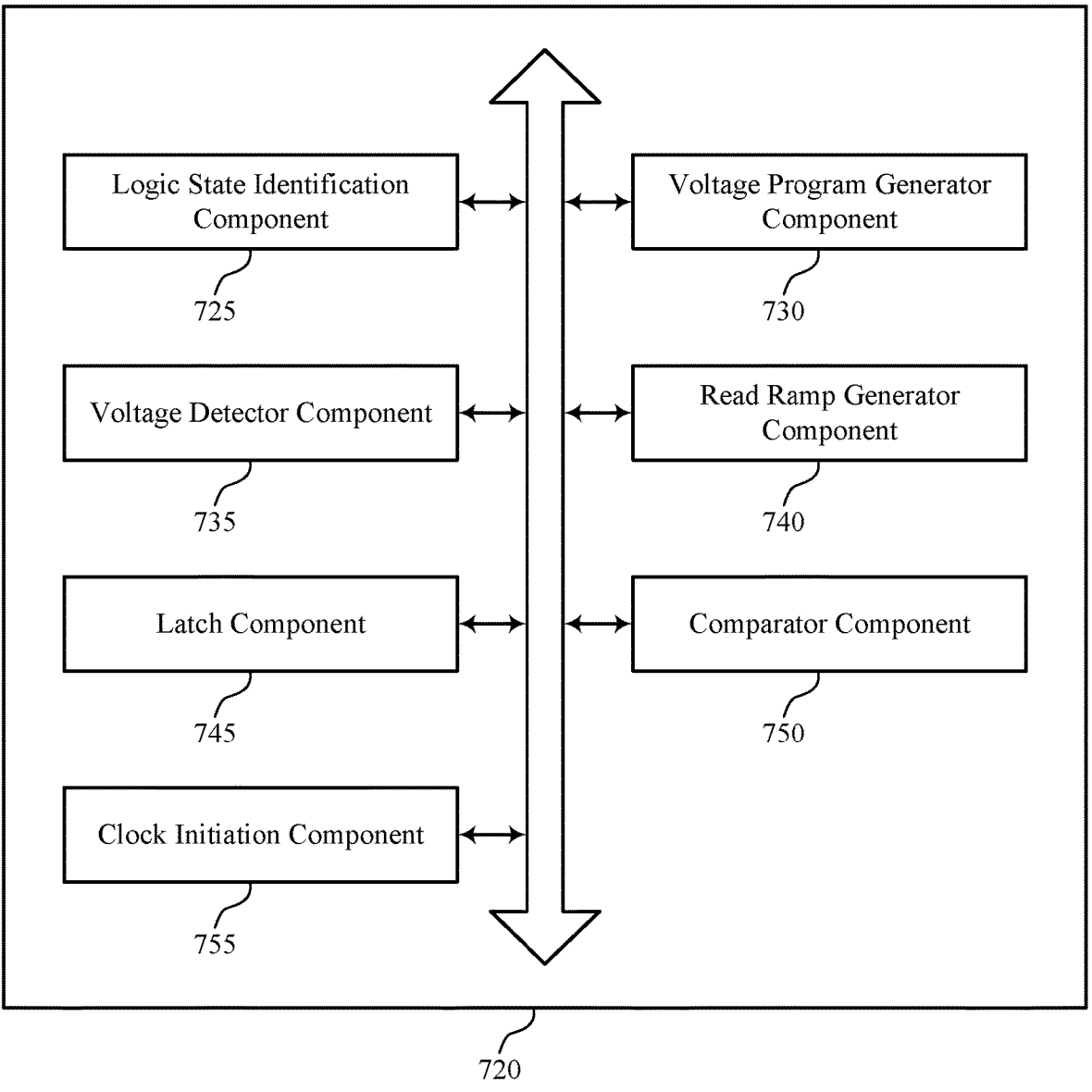
FIG. 7 shows a block diagram of a Memory device that supports pulse based multi-level cell programming in accordance with examples as disclosed herein.

FIG. 7 shows a block diagram 700 of a memory device 720 that supports pulse based multi-level cell programming in accordance with examples as disclosed herein. The memory device 720 may be an example of aspects of a memory device as described with reference to FIGS. 1 through 6. The memory device 720, or various components thereof, may be an example of means for performing various aspects of pulse based multi-level cell programming as described herein. For example, the memory device 720 may include a logic state identification component 725, a voltage program generator component 730, a voltage detector component 735, a read ramp generator component 740, a latch component 745, a comparator component 750, a clock initiation component 755, or any combination thereof. Each of these components may communicate, directly or indirectly, with one another (e.g., via one or more buses).

The logic state identification component 725 may be configured as or otherwise support a means for identifying a first logic state to store in a memory cell including a chalcogenide material, the memory cell for storing three or more logic states including a second logic state associated with a first threshold voltage, a third logic state associated with a second threshold voltage, and the first logic state associated with an intermediate threshold voltage between the first threshold voltage and the second threshold voltage. The voltage program generator component 730 may be configured as or otherwise support a means for applying a first pulse with a first polarity to the memory cell to store the second logic state in the memory cell based at least in part on identifying the first logic state. The voltage detector component 735 may be configured as or otherwise support a means for identifying a threshold voltage of the memory cell that stores the second logic state based at least in part on applying the first pulse to the memory cell. In some examples, the voltage program generator component 730 may be configured as or otherwise support a means for applying a first quantity of pulses to the memory cell to store the first logic state in the memory cell based at least in part on identifying the threshold voltage of the memory cell that stores the second logic state, the first quantity of pulses having a second polarity different than the first polarity. In some examples, the voltage program generator component 730 may be configured as or otherwise support a means for applying a second pulse with a second polarity different than the first polarity to the memory cell to store the third logic state in the memory cell based on identifying the threshold voltage of the memory cell that stores the second logic. In some examples, the voltage program generator component 730 may be configured as or otherwise support a means for applying a first quantity of pulses with the first polarity to the memory cell to store the first logic state in the memory cell based at least in part on identifying the threshold voltage of the memory cell that stores the second logic state.

In some examples, to support identifying the threshold voltage of the memory cell that stores the second logic state, the read ramp generator component 740 may be configured as or otherwise support a means for applying a ramping voltage to the memory cell, where the ramping voltage is associated with one or more clock signals indicating a set of timing latches. In some examples, to support identifying the threshold voltage of the memory cell that stores the second logic state, the latch component 745 may be configured as or otherwise support a means for storing, in one or more latches, a value of the one or more clock signals in response to the memory cell experiencing a snapback event based at least in part on applying the ramping voltage.

In some examples, the voltage detector component 735 may be configured as or otherwise support a means for identifying the threshold voltage of the memory cell based at least in part on the value of the one or more clock signals stored in the one or more latches, where applying the first quantity of pulses is based at least in part on the value of the one or more clock signals.

In some examples, the comparator component 750 may be configured as or otherwise support a means for comparing the value of the one or more clock signals stored in the one or more latches with a plurality of voltage threshold zones, where identifying threshold voltage of the memory cell is based at least in part on the comparing.

In some examples, the clock initiation component 755 may be configured as or otherwise support a means for initiating the one or more clock signals to the one or more latches based at least in part on applying the ramping voltage.

In some examples, to support selecting the first quantity of pulses, the comparator component 750 may be configured as or otherwise support a means for identifying the first quantity of pulses for storing the first logic state in the memory cell based at least in part on the threshold voltage of the memory cell, where applying the first quantity of pulses is based at least in part on identifying the first quantity of pulses.

In some examples, different quantities of pulses are associated with different voltage thresholds of the memory cell.

In some examples, a pulse current based at least in part on being associated with the first threshold voltage. In some examples, a pulse width based at least in part on being associated with the first threshold voltage.

In some examples, each pulse current is a same first pulse current and each pulse width is a same first pulse width.

In some examples, each pulse of a second quantity of pulses associated with the second threshold voltage has a second pulse current and a second pulse width, the second pulse current being different than the first pulse current, the second pulse width being different than the first pulse width.

In some examples, the voltage program generator component 730 may be configured as or otherwise support a means for applying the first pulse with the first polarity. In some examples, the voltage detector component 735 may be configured as or otherwise support a means for reading the threshold voltage of the memory cell with the first polarity. In some examples, the voltage program generator component 730 may be configured as or otherwise support a means for applying a second pulse with the second polarity to the memory cell to store the third logic state based at least in part on reading the threshold voltage of the memory cell with the first polarity, a pulse amplitude in current or a pulse duration or both of the second pulse is different than the pulse amplitude in current or pulse durations of the first quantity of pulses used for storing the first logic state.

In some examples, the voltage program generator component 730 may be configured as or otherwise support a means for applying the first pulse with the first polarity. In some examples, the voltage detector component 735 may be configured as or otherwise support a means for reading the threshold voltage of the memory cell with the first polarity, where the first polarity includes a positive polarity.

In some examples, to support applying the first pulse, the voltage program generator component 730 may be configured as or otherwise support a means for applying a first voltage to a word line. In some examples, to support applying the first pulse, the voltage program generator component 730 may be configured as or otherwise support a means for applying a second voltage to digit line that is different than the first voltage.

FIG. 8 shows a flowchart illustrating a method 800 that supports pulse based multi-level cell programming in accordance with examples as disclosed herein. The operations of method 800 may be implemented by a Memory device or its components as described herein. For example, the operations of method 800 may be performed by a Memory device as described with reference to FIGS. 1 through 7. In some examples, a Memory device may execute a set of instructions to control the functional elements of the device to perform the described functions. Additionally, or alternatively, the Memory device may perform aspects of the described functions using special-purpose hardware.

At 805, the method may include identifying a first logic state to store in a memory cell including a chalcogenide material, the memory cell for storing three or more logic states including a second logic state associated with a first threshold voltage, a third logic state associated with a second threshold voltage, and the first logic state associated with an intermediate threshold voltage between the first threshold voltage and the second threshold voltage. The operations of 805 may be performed in accordance with examples as disclosed herein. In some examples, aspects of the operations of 805 may be performed by a logic state identification component 725 as described with reference to FIG. 7.

At 810, the method may include applying a first pulse with a first polarity to the memory cell to store the second logic state in the memory cell based on identifying the first logic state. The operations of 810 may be performed in accordance with examples as disclosed herein. In some examples, aspects of the operations of 810 may be performed by a voltage program generator component 730 as described with reference to FIG. 7.

At 815, the method may include identifying a threshold voltage of the memory cell that stores the second logic state based on applying the first pulse to the memory cell. The operations of 815 may be performed in accordance with examples as disclosed herein. In some examples, aspects of the operations of 815 may be performed by a voltage detector component 735 as described with reference to FIG. 7.

At 820, the method may include applying a first quantity of pulses to the memory cell to store the first logic state in the memory cell based on identifying the threshold voltage of the memory cell that stores the second logic state, the first quantity of pulses having a second polarity different than the first polarity. The operations of 820 may be performed in accordance with examples as disclosed herein. In some examples, aspects of the operations of 820 may be performed by a voltage program generator component 730 as described with reference to FIG. 7.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for identifying a first logic state to store in a memory cell including a chalcogenide material, the memory cell for storing three or more logic states including a second logic state associated with a first threshold voltage, a third logic state associated with a second threshold voltage, and the first logic state associated with an intermediate threshold voltage between the first threshold voltage and the second threshold voltage; applying a first pulse with a first polarity to the memory cell to store the second logic state in the memory cell based at least in part on identifying the first logic state; identifying a threshold voltage of the memory cell that stores the second logic state based at least in part on applying the first pulse to the memory cell; and applying a first quantity of pulses to the memory cell to store the first logic state in the memory cell based at least in part on identifying the threshold voltage of the memory cell that stores the second logic state, the first quantity of pulses having a second polarity different than the first polarity.

Aspect 2: The method, apparatus, or non-transitory computer-readable medium of aspect 1 where identifying the threshold voltage of the memory cell that stores the second logic state, further includes operations, features, circuitry, logic, means, or instructions, or any combination thereof for applying a ramping voltage to the memory cell, where the ramping voltage is associated with one or more clock signals indicating a set of timing latches and storing, in one or more latches, a value of the one or more clock signals in response to the memory cell experiencing a snapback event based at least in part on applying the ramping voltage.

Aspect 3: The method, apparatus, or non-transitory computer-readable medium of aspect 2, further including operations, features, circuitry, logic, means, or instructions, or any combination thereof for identifying the threshold voltage of the memory cell based at least in part on the value of the one or more clock signals stored in the one or more latches, where applying the first quantity of pulses is based at least in part on the value of the one or more clock signals.

Aspect 4: The method, apparatus, or non-transitory computer-readable medium of aspect 3, further including operations, features, circuitry, logic, means, or instructions, or any combination thereof for comparing the value of the one or more clock signals stored in the one or more latches with a plurality of voltage threshold zones, where identifying threshold voltage of the memory cell is based at least in part on the comparing.

Aspect 5: The method, apparatus, or non-transitory computer-readable medium of any of aspects 2 through 4, further including operations, features, circuitry, logic, means, or instructions, or any combination thereof for initiating the one or more clock signals to the one or more latches based at least in part on applying the ramping voltage.

Aspect 6: The method, apparatus, or non-transitory computer-readable medium of any of aspects 1 through 5 where selecting the first quantity of pulses includes operations, features, circuitry, logic, means, or instructions, or any combination thereof for identifying the first quantity of pulses for storing the first logic state in the memory cell based at least in part on the threshold voltage of the memory cell, where applying the first quantity of pulses is based at least in part on identifying the first quantity of pulses.

Aspect 7: The method, apparatus, or non-transitory computer-readable medium of aspect 6 where different quantities of pulses are associated with different voltage thresholds of the memory cell.

Aspect 8: The method, apparatus, or non-transitory computer-readable medium of any of aspects 6 through 7 where a pulse current based at least in part on being associated with the first threshold voltage and a pulse width based at least in part on being associated with the first threshold voltage.

Aspect 9: The method, apparatus, or non-transitory computer-readable medium of aspect 8 where each pulse current is a same first pulse current and each pulse width is a same first pulse width.

Aspect 10: The method, apparatus, or non-transitory computer-readable medium of aspect 9 where each pulse of a second quantity of pulses associated with the second threshold voltage has a second pulse current and a second pulse width, the second pulse current being different than the first pulse current, the second pulse width being different than the first pulse width.

Aspect 11: The method, apparatus, or non-transitory computer-readable medium of any of aspects 1 through 10, further including operations, features, circuitry, logic, means, or instructions, or any combination thereof for applying the first pulse with the first polarity; reading the threshold voltage of the memory cell with the first polarity; and applying a second pulse with the second polarity to the memory cell to store the third logic state based at least in part on reading the threshold voltage of the memory cell with the first polarity, a pulse amplitude in current or a pulse duration or both of the second pulse is different than the pulse amplitude in current or pulse durations of the first quantity of pulses used for storing the first logic state.

Aspect 12: The method, apparatus, or non-transitory computer-readable medium of any of aspects 1 through 11, further including operations, features, circuitry, logic, means, or instructions, or any combination thereof for applying the first pulse with the first polarity and reading the threshold voltage of the memory cell with the first polarity, where the first polarity includes a positive polarity.

Aspect 13: The method, apparatus, or non-transitory computer-readable medium of any of aspects 1 through 12 where applying the first pulse, further includes operations, features, circuitry, logic, means, or instructions, or any combination thereof for applying a first voltage to a word line and applying a second voltage to digit line that is different than the first voltage.

FIG. 9 shows a flowchart illustrating a method 900 that supports pulse based multi-level cell programming in accordance with examples as disclosed herein. The operations of method 900 may be implemented by a Memory device or its components as described herein. For example, the operations of method 900 may be performed by a Memory device as described with reference to FIGS. 1 through 7. In some examples, a Memory device may execute a set of instructions to control the functional elements of the device to perform the described functions. Additionally, or alternatively, the Memory device may perform aspects of the described functions using special-purpose hardware.

At 905, the method may include identifying a first logic state to store in a memory cell including a chalcogenide material, the memory cell for storing three or more logic states including a second logic state associated with a first threshold voltage, a third logic state associated with a second threshold voltage, and the first logic state associated with an intermediate threshold voltage between the first threshold voltage and the second threshold voltage. The operations of 905 may be performed in accordance with examples as disclosed herein. In some examples, aspects of the operations of 905 may be performed by a logic state identification component 725 as described with reference to FIG. 7.

At 910, the method may include applying a first pulse with a first polarity to the memory cell to store the second logic state in the memory cell based on identifying the first logic state. The operations of 910 may be performed in accordance with examples as disclosed herein. In some examples, aspects of the operations of 910 may be performed by a voltage program generator component 730 as described with reference to FIG. 7.

At 915, the method may include identifying a threshold voltage of the memory cell that stores the second logic state based on applying the first pulse to the memory cell. The operations of 915 may be performed in accordance with examples as disclosed herein. In some examples, aspects of the operations of 915 may be performed by a voltage detector component 735 as described with reference to FIG. 7.

At 920, the method may include applying a second pulse with a second polarity different than the first polarity to the memory cell to store the third logic state in the memory cell based on identifying the threshold voltage of the memory cell that stores the second logic. The operations of 920 may be performed in accordance with examples as disclosed herein. In some examples, aspects of the operations of 920 may be performed by a voltage program generator component 730 as described with reference to FIG. 7.

At 925, the method may include applying a first quantity of pulses with the first polarity to the memory cell to store the first logic state in the memory cell on identifying the threshold voltage of the memory cell that stores the second logic state. The operations of 925 may be performed in accordance with examples as disclosed herein. In some examples, aspects of the operations of 925 may be performed by a voltage program generator component 730 as described with reference to FIG. 7.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 14: A method, apparatus, or non-transitory computer-readable medium including operations, features, circuitry, logic, means, or instructions, or any combination thereof for identifying a first logic state to store in a memory cell including a chalcogenide material, the memory cell for storing three or more logic states including a second logic state associated with a first threshold voltage, a third logic state associated with a second threshold voltage, and the first logic state associated with an intermediate threshold voltage between the first threshold voltage and the second threshold voltage; applying a first pulse with a first polarity to the memory cell to store the second logic state in the memory cell based at least in part on identifying the first logic state; identifying a threshold voltage of the memory cell that stores the second logic state based at least in part on applying the first pulse to the memory cell; applying a second pulse with a second polarity different than the first polarity to the memory cell to store the third logic state in the memory cell based at least in part on identifying the threshold voltage of the memory cell that stores the second logic; and applying a first quantity of pulses with the first polarity to the memory cell to store the first logic state in the memory cell based at least in part on identifying the threshold voltage of the memory cell that stores the second logic state.

Aspect 15: The method, apparatus, or non-transitory computer-readable medium of aspect 14 where identifying the threshold voltage of the memory cell that stores the second logic state, further includes operations, features, circuitry, logic, means, or instructions, or any combination thereof for applying a ramping voltage to the memory cell, where the ramping voltage is associated with one or more clock signals indicating a set of timing latches and storing, in one or more latches, a value of the one or more clock signals in response to the memory cell experiencing a snapback event based at least in part on applying the ramping voltage.

Aspect 16: The method, apparatus, or non-transitory computer-readable medium of aspect 15, further including operations, features, circuitry, logic, means, or instructions, or any combination thereof for identifying the threshold voltage of the memory cell based at least in part on the value of the one or more clock signals stored in the one or more latches, where applying the first quantity of pulses is based at least in part on the value of the one or more clock signals.

Aspect 17: The method, apparatus, or non-transitory computer-readable medium of aspect 16, further including operations, features, circuitry, logic, means, or instructions, or any combination thereof for comparing the value of the one or more clock signals stored in the one or more latches with a plurality of voltage threshold zones, where identifying threshold voltage of the memory cell is based at least in part on the comparing.

Aspect 18: The method, apparatus, or non-transitory computer-readable medium of any of aspects 15 through 17, further including operations, features, circuitry, logic, means, or instructions, or any combination thereof for initiating the one or more clock signals to the one or more latches based at least in part on applying the ramping voltage.

Aspect 19: The method, apparatus, or non-transitory computer-readable medium of any of aspects 14 through 18 where selecting the first quantity of pulses includes operations, features, circuitry, logic, means, or instructions, or any combination thereof for identifying the first quantity of pulses for storing the first logic state in the memory cell based at least in part on the threshold voltage of the memory cell, where applying the first quantity of pulses is based at least in part on identifying the first quantity of pulses.

Aspect 20: The method, apparatus, or non-transitory computer-readable medium of aspect 19 where different quantities of pulses are associated with different voltage thresholds of the memory cell.

Aspect 21: The method, apparatus, or non-transitory computer-readable medium of any of aspects 19 through 20 where a pulse current based at least in part on being associated with the first threshold voltage and a pulse width based at least in part on being associated with the first threshold voltage.

Aspect 22: The method, apparatus, or non-transitory computer-readable medium of aspect 21 where each pulse current is a same first pulse current and each pulse width is a same first pulse width.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 23: An apparatus, including: a processor; memory coupled with the processor; and instructions stored in the memory and executable by the processor to cause the apparatus to: identify a first logic state to store in a memory cell including a chalcogenide material, the memory cell for storing three or more logic states including a second logic state associated with a first threshold voltage, a third logic state associated with a second threshold voltage, and the first logic state associated with an intermediate threshold voltage between the first threshold voltage and the second threshold voltage; apply a first pulse with a first polarity to the memory cell to store the second logic state in the memory cell based at least in part on identifying the first logic state; identify a threshold voltage of the memory cell that stores the second logic state based at least in part on applying the first pulse to the memory cell; and apply a first quantity of pulses to the memory cell to store the first logic state in the memory cell based at least in part on identifying the threshold voltage of the memory cell that stores the second logic state, the first quantity of pulses having a second polarity different than the first polarity.

Aspect 24: The apparatus of aspect 23, where the instructions to identify the threshold voltage of the memory cell that stores the second logic state are further executable by the processor to cause the apparatus to: apply a ramping voltage to the memory cell, where the ramping voltage is associated with one or more clock signals indicating a set of timing latches; and store, in one or more latches, a value of the one or more clock signals in response to the memory cell experiencing a snapback event based at least in part on applying the ramping voltage.

Aspect 25: The apparatus of aspect 24, where the instructions are further executable by the processor to cause the apparatus to: identify the threshold voltage of the memory cell based at least in part on the value of the one or more clock signals stored in the one or more latches, where applying the first quantity of pulses is based at least in part on the value of the one or more clock signals.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory system, comprising:
a set of memory cells configured to store three or more logic states, the three or more logic states comprising a first logic state, a second logic state associated with a first threshold voltage, and a third logic state associated with a second threshold voltage, wherein the first logic state is associated with an intermediate threshold voltage between the first threshold voltage and the second threshold voltage;
a voltage ramp generator configured to increase a ramping voltage induced on a memory cell of the set of memory cells over a duration;
one or more latches configured to store a value of one or more clock signals associated with the ramping voltage over the duration, wherein the value stored at the one or more latches is associated with a threshold voltage that stores the second logic state at the memory cell; and
a voltage program generator configured to:
apply a first pulse with a first polarity to the memory cell to store the second logic state in the memory cell; and
apply a first quantity of pulses with a second polarity to the memory cell to store the first logic state at the memory cell based at least in part on the threshold voltage of the memory cell that stores the second logic state.

2. The memory system of claim 1, wherein the first quantity of pulses is associated with an adaptive programming scheme.

3. The memory system of claim 1, wherein after the first quantity of pulses are applied, the memory system refrains from verifying that the first logic state is stored at the memory cell in accordance with the voltage program generator being configured to apply the first quantity of pulses.

4. The memory system of claim 1, wherein:
the first pulse is configured to store the second logic state at the memory cell; and the first quantity of pulses is associated with an adaptive programming scheme that is independent of the first pulse.

5. The memory system of claim 1, wherein the memory system further comprises a voltage detector configured to:
identify a snapback event of the memory cell based at least in part on the ramping voltage induced on the memory cell over the duration; and
trigger the one or more latches to store the value of the one or more clock signals based at least in part on the snapback event of the memory cell.

6. The memory system of claim 1, wherein the memory system further comprises a comparator configured to:
identify the first quantity of pulses based at least in part on a table that associates the value stored at the one or more latches with the first quantity of pulses, wherein different values of the table are associated with different quantities of pulses; and
transmit, to a switch of the memory system, an indication of the first quantity of pulses.

7. The memory system of claim 6, wherein the switch of the memory system is configured to:
close based at least in part on receiving, from the comparator, the indication of the first quantity of pulses.

8. The memory system of claim 7, wherein to apply the first quantity of pulses to the memory cell, the voltage program generator if further configured to:
transmit the first quantity of pulses to a bit line decoder of the memory system, wherein the first quantity of pulses induces a voltage difference across the memory cell based at least in part on the switch being closed.

9. The memory system of claim 1, wherein different quantities of pulses are associated with different voltage thresholds of the memory cell.

10. The memory system of claim 1, wherein each pulse of the first quantity of pulses further comprise:
a pulse current based at least in part on being associated with the first threshold voltage; and
a pulse width based at least in part on being associated with the first threshold voltage.

11. A memory system, comprising:
a set of memory cells configured to store three or more logic states, the three or more logic states comprising a first logic state, a second logic state associated with a first threshold voltage, and a third logic state associated with a second threshold voltage, wherein the first logic state is associated with an intermediate threshold voltage between the first threshold voltage and the second threshold voltage;
a voltage ramp generator configured to increase a ramping voltage induced on a memory cell of the set of memory cells over a duration;
one or more latches configured to store a value of one or more clock signals associated with the ramping voltage over the duration, wherein the value stored at the one or more latches is associated with a threshold voltage that stores the second logic state at the memory cell; and
a voltage program generator configured to:
apply a first pulse with a first polarity to the memory cell to store the second logic state in the memory cell;
apply a second pulse with a second polarity different than the first polarity to the memory cell to store the third logic state in the memory cell; and
apply a first quantity of pulses with the first polarity to the memory cell to store the first logic state at the memory cell based at least in part on the threshold voltage of the memory cell that stores the second logic state.

12. The memory system of claim 11, wherein the first quantity of pulses is associated with an adaptive programming scheme.

13. The memory system of claim 11, wherein after the first quantity of pulses are applied, the memory system refrains from verifying that the first logic state is stored at the memory cell in accordance with the voltage program generator being configured to apply the first quantity of pulses.

14. The memory system of claim 11, wherein:

the first pulse is configured to store the second logic state at the memory cell;

the second pulse is configured to store the third logic state at the memory cell; and the first quantity of pulses is associated with an adaptive programming scheme that is independent of the first pulse and the second pulse.

15. The memory system of claim 11, wherein the memory system further comprises a voltage detector configured to:

identify a snapback event of the memory cell based at least in part on the ramping voltage induced on the memory cell over the duration; and trigger the one or more latches to store the value of the one or more clock signals based at least in part on the snapback event of the memory cell.

16. The memory system of claim 11, wherein the memory system further comprises a comparator configured to:

identify the first quantity of pulses based at least in part on a table that associates the value stored at the one or more latches with the first quantity of pulses, wherein different values of the table are associated with different quantities of pulses; and transmit, to a switch of the memory system, an indication of the first quantity of pulses.

17. The memory system of claim 16, wherein the switch of the memory system is configured to:

close based at least in part on receiving, from the comparator, the indication of the first quantity of pulses.

18. The memory system of claim 17, wherein to apply the first quantity of pulses to the memory cell, the voltage program generator if further configured to:

transmit the first quantity of pulses to a bit line decoder of the memory system, wherein the first quantity of pulses induces a voltage difference across the memory cell based at least in part on the switch being closed.

19. The memory system of claim 11, wherein different quantities of pulses are associated with different voltage thresholds of the memory cell.

20. A memory system, comprising:

a set of memory cells configured to store three or more logic states, the three or more logic states comprising a first logic state, a second logic state associated with a first threshold voltage, and a third logic state associated with a second threshold voltage, wherein the first logic state is associated with an intermediate threshold voltage between the first threshold voltage and the second threshold voltage;

a voltage ramp generator configured to increase a ramping voltage induced on a memory cell of the set of memory cells over a duration;

a voltage detector configured to identify a snapback event of the memory cell based at least in part on the ramping voltage induced on the memory cell over the duration;

one or more latches configured to store a value of one or more clock signals associated with the ramping voltage over the duration based at least in part on the snapback event, wherein the value stored at the one or more latches is associated with a threshold voltage that stores the second logic state at the memory cell;

a comparator configured to identify a first quantity of pulses based at least in part on a table that associates the value stored at the one or more latches with the first quantity of pulses; and a voltage program generator configured to:

apply a first pulse with a first polarity to the memory cell to store the second logic state in the memory cell; and apply the first quantity of pulses with a second polarity to the memory cell to store the first logic state at the memory cell based at least in part on the threshold voltage of the memory cell that stores the second logic state.

* * * * *